(12) United States Patent
Dirnecker et al.

(10) Patent No.: US 7,227,241 B2
(45) Date of Patent: Jun. 5, 2007

(54) INTEGRATED STACKED CAPACITOR AND METHOD OF FABRICATING SAME

(75) Inventors: Christoph Dirnecker, Haag (DE); Jeffrey Babcock, Sunnyvale, CA (US); Scott Balster, Munich (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/850,797

(22) Filed: May 20, 2004

(65) Prior Publication Data
US 2005/0006687 A1   Jan. 13, 2005

(30) Foreign Application Priority Data
May 27, 2003   (DE) ................ 103 24 055

(51) Int. Cl.
*H01L 29/00* (2006.01)
(52) U.S. Cl. ............................. 257/532; 257/535
(58) Field of Classification Search ........... 257/532, 257/535, 758, 915, 303
See application file for complete search history.

(56) References Cited

U.S. PATENT DOCUMENTS

| 4,731,696 A | 3/1988 | Himes et al. |
| 5,589,416 A * | 12/1996 | Chittipeddi ............... 438/396 |
| 6,066,537 A | 5/2000 | Poh |
| 6,359,296 B1 * | 3/2002 | Willer ..................... 257/295 |
| 6,387,753 B1 | 5/2002 | Clark |
| 2002/0056869 A1 * | 5/2002 | Morimoto ................. 257/313 |
| 2005/0006687 A1 * | 1/2005 | Dirnecker et al. .......... 257/303 |

FOREIGN PATENT DOCUMENTS

EP    1 205 976 A2    5/2002

OTHER PUBLICATIONS

IBM Technical Disclosure Bulletin, vol. 17, No. 6, pp. 1569-1570, by Arzubi et al., Nov. 1974.*

* cited by examiner

*Primary Examiner*—Mark V. Prenty
(74) *Attorney, Agent, or Firm*—Jacqueline J. Garner; W. James Brady, III; Frederick J. Telecky, Jr.

(57) ABSTRACT

An integrated stacked capacitor comprises a first capacitor film (46) of polycrystalline silicide (poly), a second capacitor film (48) and a first dielectric (26) sandwiched between the first capacitor film (46) and second capacitor film (48). A second dielectric (34) and a third capacitor film (50) are provided. The second dielectric (34) is sandwiched between the second capacitor film (48) and third capacitor film (50). A method for fabrication of an integrated stacked capacitor comprises the following sequence of steps: applying a polysilicide layer (20) to form the first capacitor film (46); applying a first dielectric (26); applying a first metallization layer (28) to form the second capacitor film (48); applying a second dielectric (34); and applying a second metallization layer (34) to form the third capacitor film (50).

7 Claims, 15 Drawing Sheets

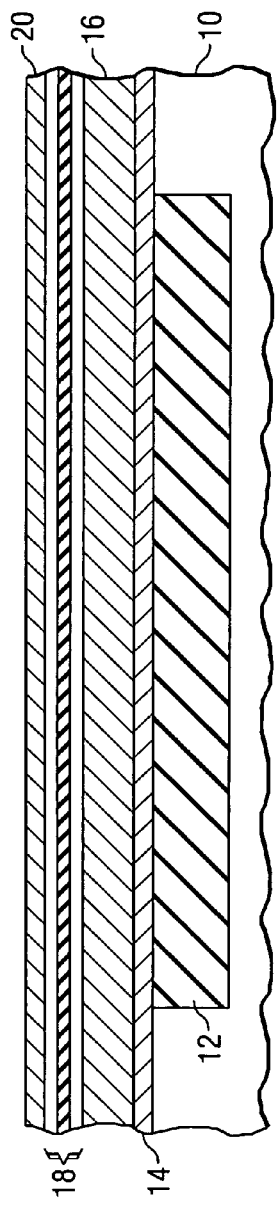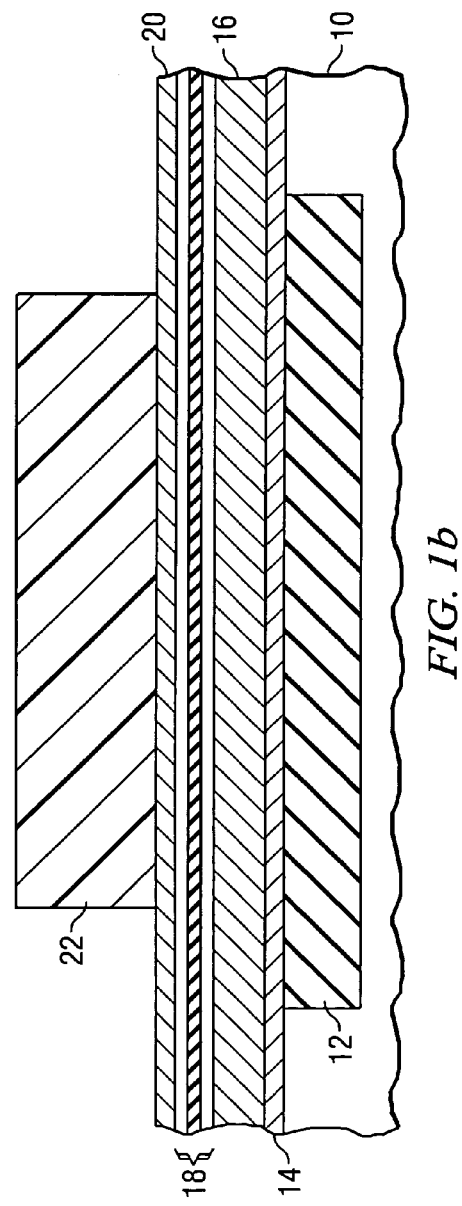

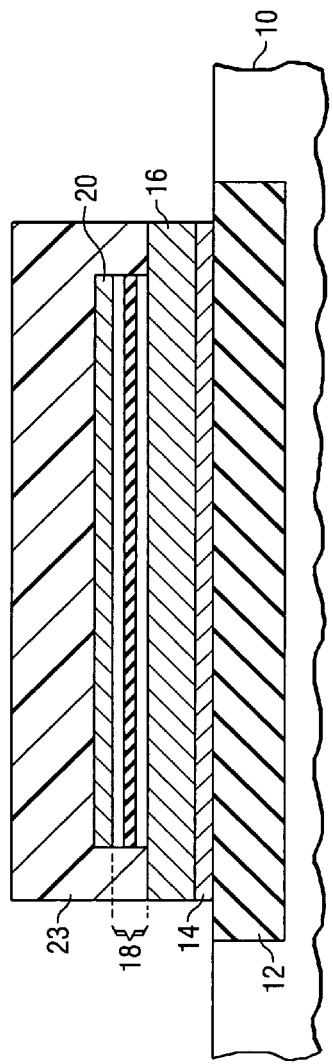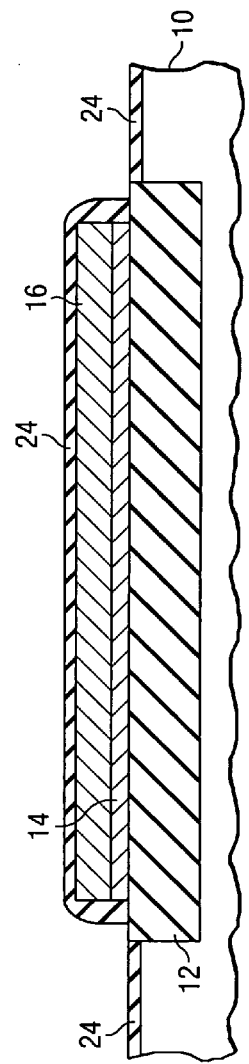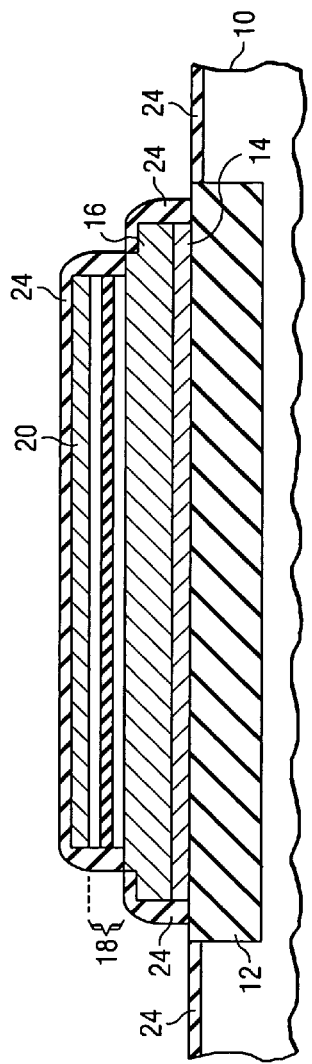
FIG. 3b
FIG. 4a
FIG. 4b

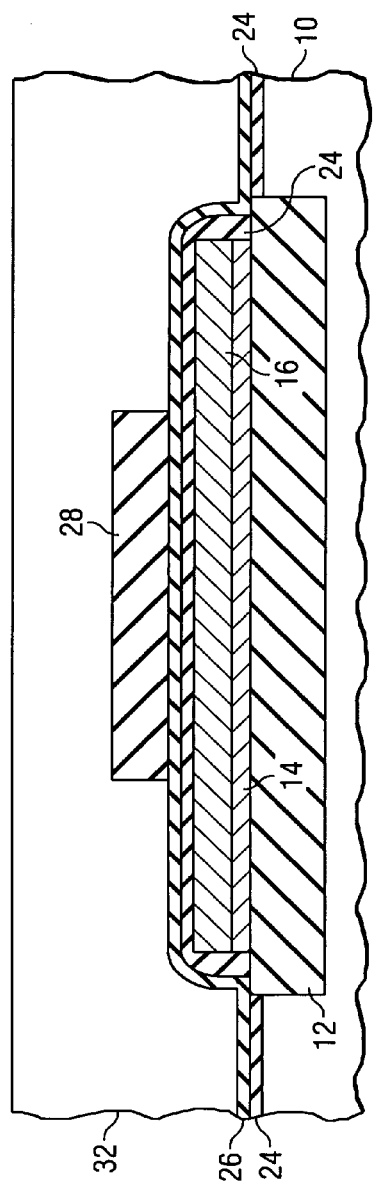
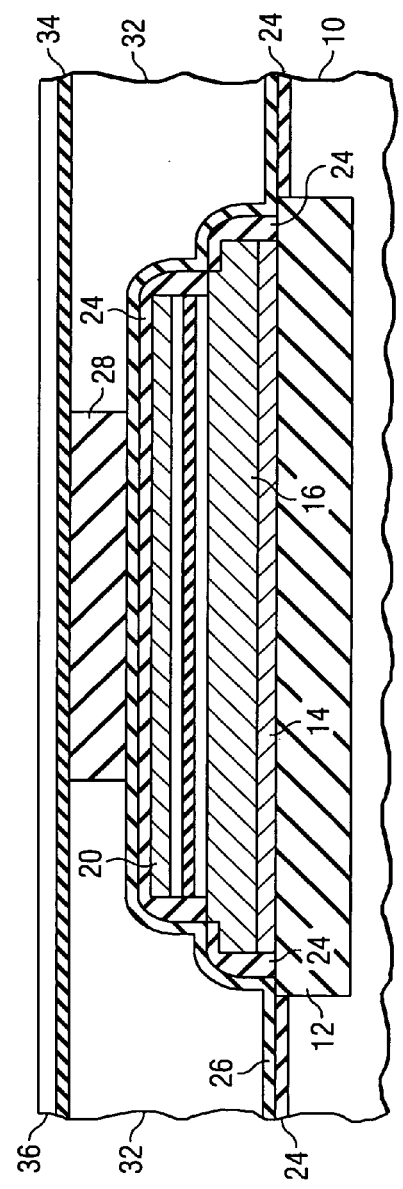
FIG. 7a
FIG. 7b

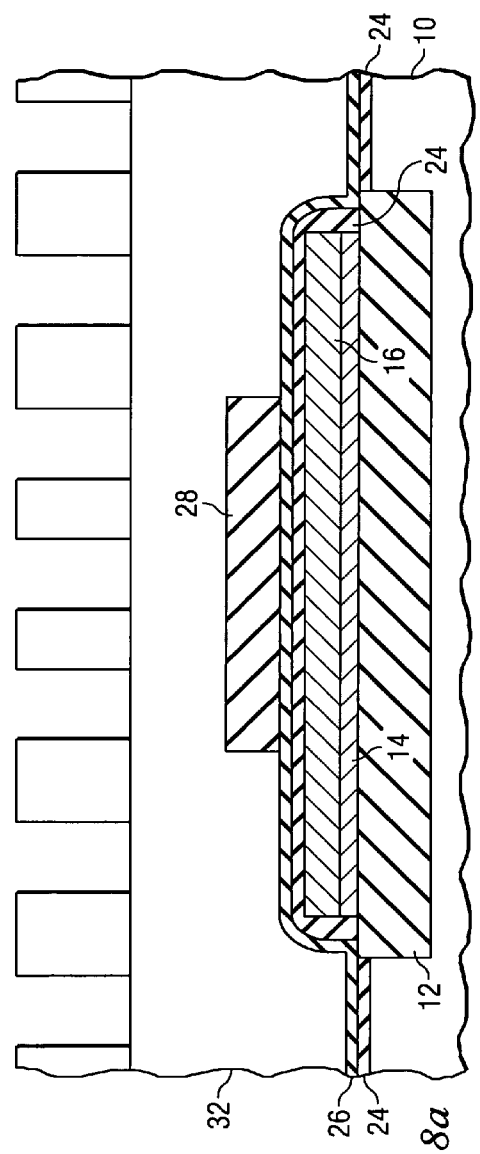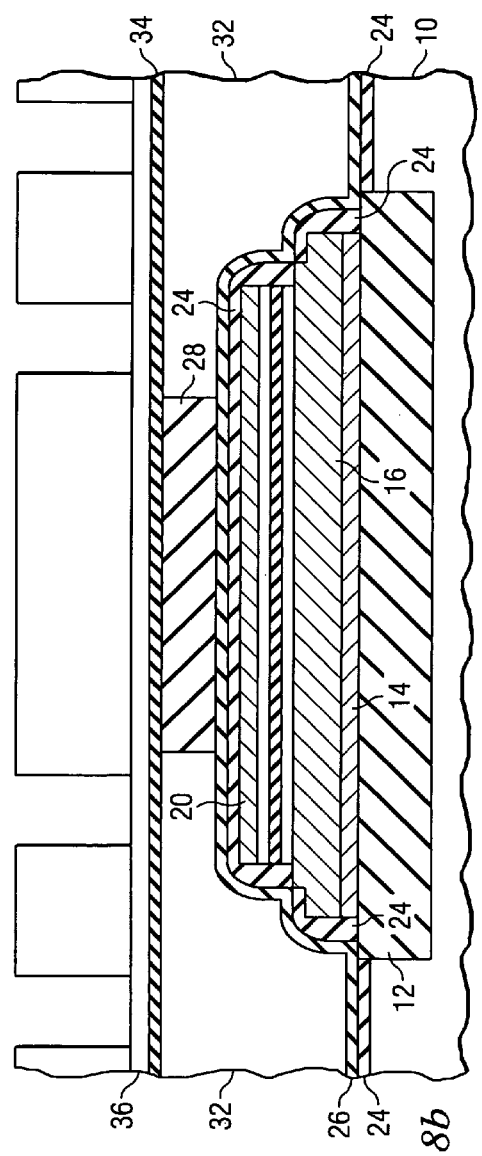

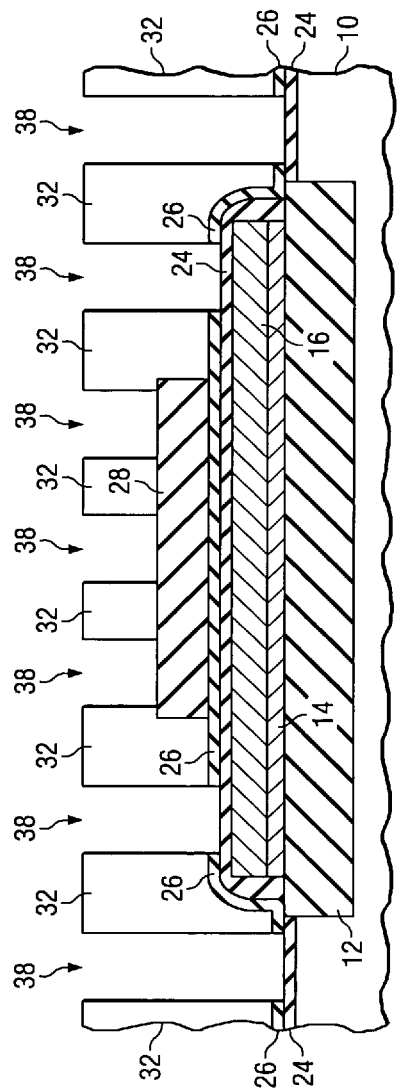
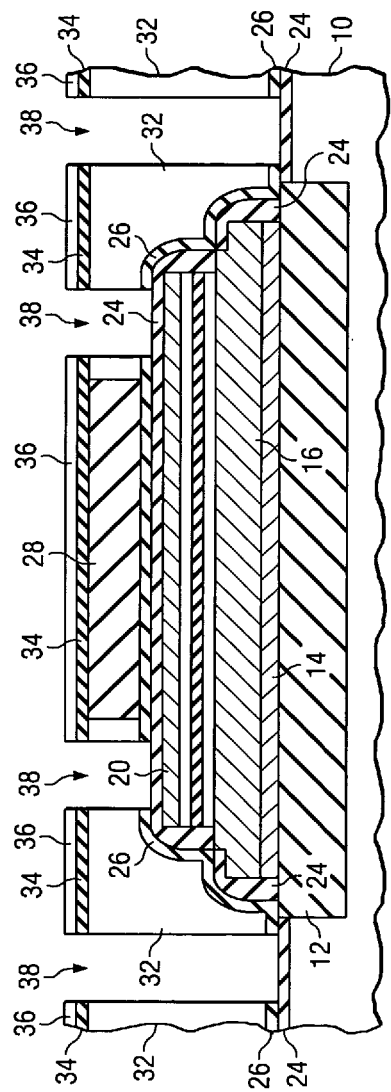
FIG. 9a
FIG. 9b

INTEGRATED STACKED CAPACITOR AND METHOD OF FABRICATING SAME

FIELD OF THE INVENTION

The invention relates to an integrated stacked capacitor comprising a first capacitor film of polycrystalline silicide (polysilicide layer), a second capacitor film and a first dielectric sandwiched between the first capacitor film and second capacitor film. The invention relates furthermore to a method of fabricating an integrated stacked capacitor.

BACKGROUND OF THE INVENTION

Stacked capacitors often find application in integrated circuits, the down-sizing of which is continually being sophisticated. The demand for ever-smaller chip sizes is not easy to satisfy because of the necessary dimensions of the passive components of the circuits. The approaches to date to enhancing the performance of stacked capacitors per component volume unit are as follows:

Reducing the thickness of conventional dielectrics such as silicon oxide or silicon nitride. Such a reduction necessitates, however, better control in depositing the dielectrics, especially as regards their thickness and defects. In addition, a better material quality is needed to meet the requirements as to component lifetime. In prior art, high-temperature LPCVD processes have proven to be superior to low-temperature PECVD processes. When, however, capacitors including plates are provided integrated in metallization layers (aluminum), the temperature must not exceed a critical limit because of the structural integrity requirements of the metallization layers. Apart from this, low-temperature processes are given preference when diffusion-prompted changes in the silicon doping profiles are to be avoided. For reliability reasons, the capacitive density for dielectrics deposited in a PECVD process, is typically restricted to 1.5 fF/$\mu m^2$ (oxide) and 3 fF/$\mu m^2$ (nitride).

Using dielectrics having a high dielectric constant. Making use of materials such as titanium dioxide ($TiO_2$), tantalum pentoxide ($Ta_2O_5$) or barium strontium titanate ($Ba_xSr_{1-x}TiO_3$) would appear to be very promising because of the relatively high dielectric constants, but is not yet established. The majority of these materials have a high leakage current rate and component fabrication is highly problematic. Acceptable breakdown and leakage properties are achievable hitherto only with relative thick films preventing advantageous use of the superior dielectric properties of these materials. Apart from this, introducing these new materials necessitates creating additional clean room space for new hardware and new chemicals as well as added complications in production planning, all of which adds to the production costs. Integrating fabrication in an existing process line likewise involves changes in the technology architecture.

Exploiting the vertical chip dimension to enhance the effective surface area of a capacitor. Providing a suitable topography making better use of the vertical dimension of a component necessitates the development of new patterning processes and/or the introduction of additional masking layers. Furthermore, additional process requirements such as critical dimension (CD) control, etching selectivity, step coverage and planarity need to be satisfied. Application of this kind of structures is often restricted by the requirements of the particular applications. Due to the change in the vertical geometry, the series resistance of the capacitor films is increased, resulting in a lower Q of the capacitor, making it unsuitable for certain high-frequency applications. Precision and adaptability are limited by the lithographic and etching possibilities, likewise the variation in the vertical thickness.

In integrated circuits comprising interlinked layers the capacitive density can be enhanced by stacking two (or more) conventional capacitors by simply reproducing the same structure on different metallization layers. However, the costs for introducing an additional metallization layer and various other patterning steps in a process line continue to be unjustified until the investment needed for chip size reduction is compensated by a higher yield and a commensurate integrated circuit qualification rate.

In the ever-increasing integration of many components into a single integrated circuit it is desirable to use the same type of capacitor for several applications, e.g. for high-frequency or ultra-precision analog applications. For blocking capacitors having a very high capacitance, preference is given to silicon nitride as the dielectric material because of its high dielectric constant. Capacitors used in ultra-precision analog applications necessitate, however, a much better linearity and frequency independency, resulting in silicon oxide with its lower dielectric constant being the best choice. In such conflicting requirements the process line permits optimizing only for the one or the other application, resulting in a compromise as regards product performance as a whole. As an alternative, in meeting customer requirements, two different capacitor types having the same technology can be made available which, however, adds to the costs and complexity of the process line.

SUMMARY

The object of the invention is to provide an integrated stacked capacitor featuring enhanced performance and flexible application for a given space requirement.

The integrated stacked capacitor of the invention comprises a first capacitor film, a second capacitor film, and a first dielectric sandwiched between the first capacitor film and second capacitor film. A second dielectric and a third capacitor film are provided. The second dielectric is sandwiched between the second capacitor film and third capacitor film. A method for fabrication of an integrated stacked capacitor comprises the following sequence of steps: applying a polysilicide layer to form the first capacitor film; applying a first dielectric; applying a first metallization layer to form the second capacitor film; applying a second dielectric; and applying a second metallization layer to form the third capacitor film.

BRIEF DESCRIPTION OF THE DRAWINGS

Further features and advantages of the invention will now be detailed with reference to the attached drawings in which FIGS. 1a, 2a . . . 12a are diagrammatic section views illustrating fabrication of a prior art integrated stacked capacitor;

FIGS. 1b, 2b . . . 12b are diagrammatic section views illustrating fabrication of an integrated stacked capacitor according to the invention;

FIG. 13b is a section view taken along line A in FIG. 13a;

FIG. 13c is a section view taken along line B in FIG. 13a;

FIG. 14b is a section view taken along line C in FIG. 14a; and

FIG. 14c is a section view taken along line D in FIG. 14a.

DESCRIPTION OF THE EMBODIMENTS

Figure 2A:
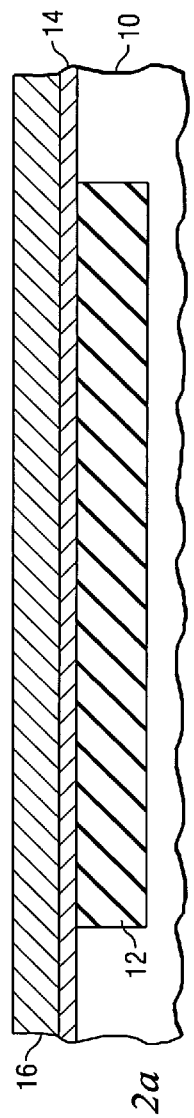

For a capacitor according to the invention, a second dielectric and a third capacitor film are provided, the second dielectric being sandwiched between the second capacitor film and the third capacitor film. The invention thus provides a MIMIM (metal-insulator-metal-insulator-metal) parallel plate capacitor in which the second capacitor film is not a cover plate but a middle film sandwiched between two outer capacitor films, with a dielectric being provided between the films in each case. The capacitor according to the invention is distinguished by a high capacitive density and is compatible with a variety of applications by suitably circuiting the individual capacitor films.

The second (middle) film preferably consists of titanium nitride or a titanium alloy.

For certain applications it is of advantage when the first dielectric consists of a nitride and the second dielectric of an oxide or when the first dielectric and second dielectric each consist of a nitride, or when the first dielectric and second dielectric each consist of an oxide.

A capacitor according to the invention in which the first film is deposited on a layer sequence provided on a substrate, preferably on an oxide-nitride-oxide layer sequence deposited in turn on a lower polysilicide layer, can be fabricated at no major additional expense in an existing BiCMOS process line providing deposition of these layers as standard. Apart from this, the resulting topographically higher position of the first film on which the further layers are deposited brings added advantages in implementing later patterning process steps.

The invention also provides a method of fabricating a capacitor according to the invention, comprising the following steps: applying a polysilicide layer to form the first capacitor film; applying a first dielectric; applying a first metallization layer to form the second capacitor film; applying a second dielectric; and applying a second metallization layer to form the third capacitor film.

The method according to the invention can be integrated into an existing BiCMOS process for fabrication of a known integrated circuit with few additional complications and highly cost-effectively. The method according to the invention necessitates just one additional step in the process, namely depositing the second dielectric. All other steps in the process can be taken over from the prior art method and differ only slightly in patterning the individual layers.

Preferably the polysilicide layer is applied to an oxide-nitride-oxide layer sequence arranged on a lower polysilicide layer. The oxide-nitride-oxide layer sequence and the lower polysilicide layer which is provided as standard in the prior art method for fabricating the known integrated circuit, can be made use of to relocate the first film of the capacitor according to the invention topographically upwards.

It is also of advantage, following application of the first metallization layer, to provide the following steps: applying a pre-metal dielectric and planarizing the pre-metal dielectric, the planarizing re-exposing the second metallization layer.

In the method according to the invention it may also be provided for that an etchable stop layer for chemical-mechanical polishing is applied to the first dielectric. Such a stop layer protects the second dielectric from damage from chemical-mechanical polishing in a later step in the process.

The following describes the fabrication of a prior art integrated stacked capacitor and parallel thereto the fabrication of a capacitor according to the invention, to illustrate by comparing the individual working steps the differences between the prior art method of fabrication and the novel structure of the capacitor according to the invention obtained thereby. For this purpose FIGS. 1 to 12 suffixed "a" show the prior art capacitor after the various steps in the process, whilst the Figs. suffixed "b" show the capacitor according to the invention after a comparable step in each case.

Figure 2B:
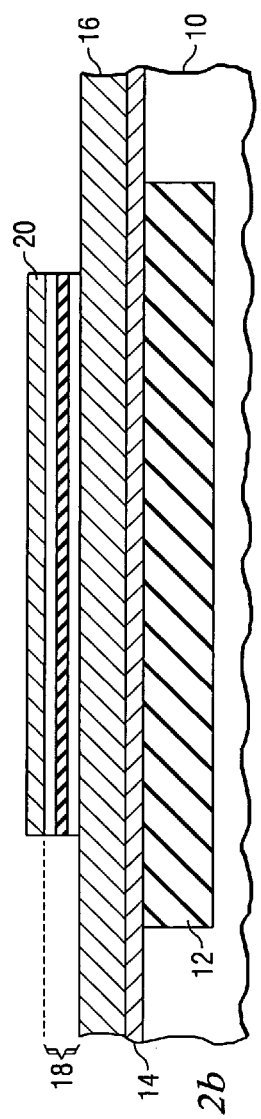

Used as standard for both capacitors is a silicon substrate 10 incorporating a shallow trench isolation (STI) 12, i.e. a trench structure filled with an insulator and etched so as to be planar. As an alternative, the insulation can also be produced by field oxidation. On the silicon substrate 10 on which a layer 14 of polycrystalline silicide (poly layer) already exists from previous steps in the process not shown, a further polysilicide layer 16 is deposited, followed by an oxide-nitride-oxide layer sequence 18. Deposited then on the oxide-nitride-oxide layer sequence 18 is an emitter layer 20 of polycrystalline silicide. In subsequent masking with resist 22 in the prior art method of fabrication the complete capacitor zone is exposed (FIG. 1a), whilst in the method according to the invention a middle portion remains covered with resist 22 (FIG. 1b). Accordingly, in subsequent etching of the emitter layer 20 and oxide-nitride-oxide layer sequence 18 in the prior art method of fabrication, both the emitter layer 20 and the oxide-nitride-oxide layer sequence 18 are etched away in the complete capacitor zone (FIG. 2a), whilst in the method according to the invention the corresponding layers remain in the middle portion that has previously been covered with resist 22. Accordingly, on removal of the resist 22 the structure as shown in FIG. 2b materializes with a raised emitter layer 20 later forming the lower film 46 of the capacitor according to the invention (see FIG. 12b). Due to the "elevation" of the lower film 46 the capacitor according to the invention later assumes a topographically higher position than the prior art capacitor.

Figure 3A:
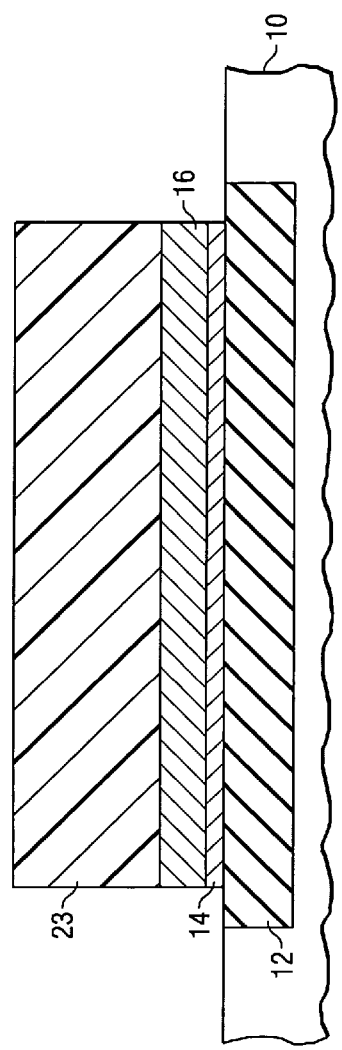
Figure 5A:
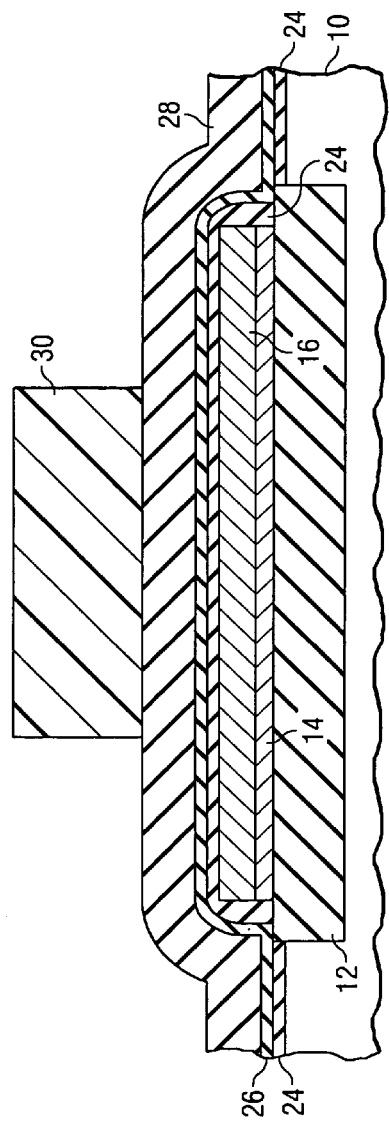
Figure 5B:
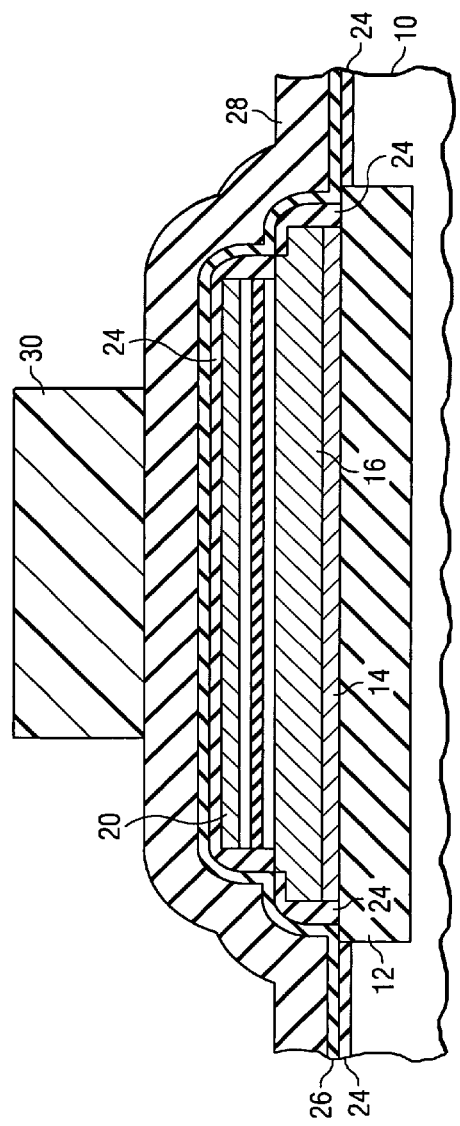

Referring now to FIGS. 3a and 3b there is illustrated how the polysilicide layer 16 by itself or including the layers thereabove, is patterned by masking and subsequent etching. In the prior art fabrication method this step defines the lower film 46 of the capacitor (FIGS. 3a, 12a) whilst in the fabrication method according to the invention a step structure is formed in which the lower polysilicide layer 16 protrudes laterally beyond the upper emitter layer 20 (FIG. 3b).

Figure 6A:
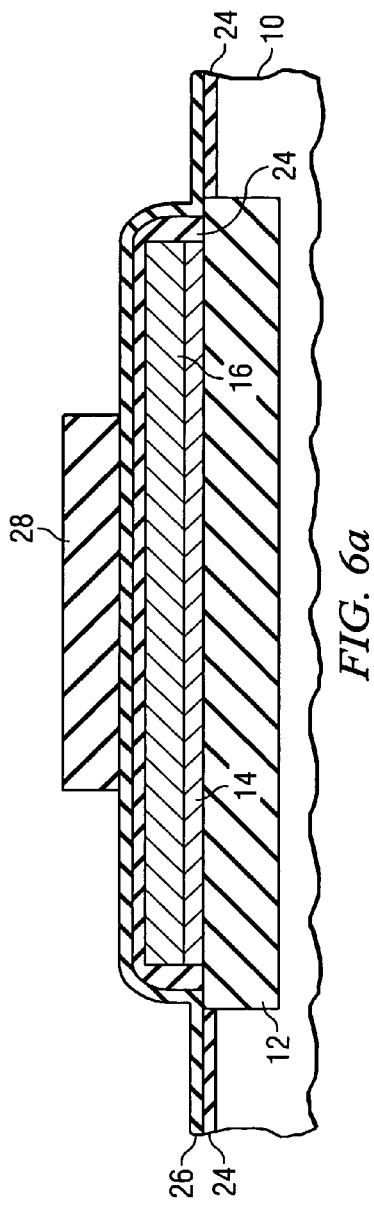
Figure 6B:
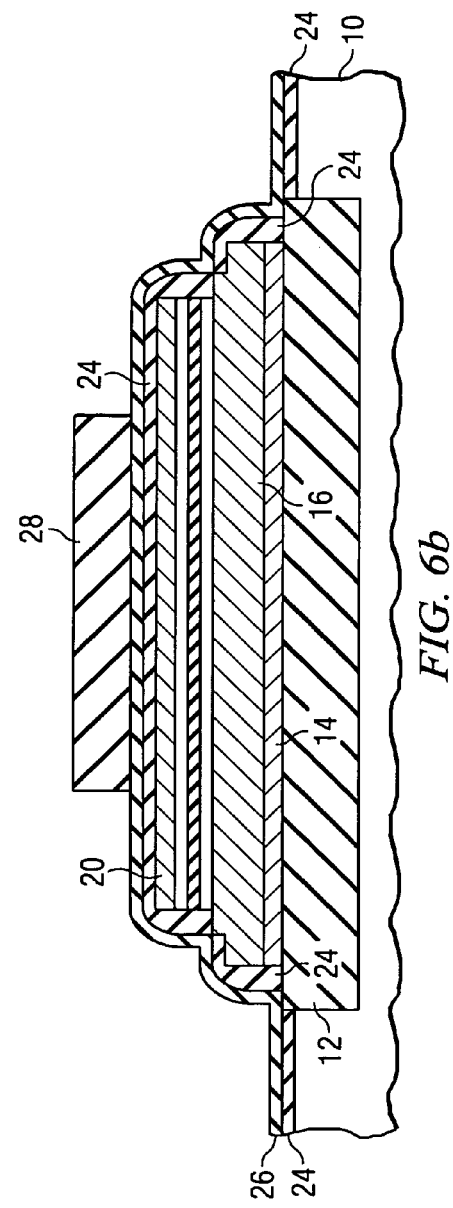

Following removal of the resist 23, both methods of fabrication then include nitriding, an etching process for forming the "spacers" at defined locations, and titanium deposition. This is followed by a titanium silicide formation being activated at the silicon/titanium interfaces, after which the remaining titanium is removed and the formed titanium silicide 24 subjected to an annealing process resulting in the structures as shown in FIGS. 4a and 4b, respectively. On these structures first a layer of a first dielectric 26, preferably an oxide or nitride, followed by a titanium nitride layer 28 is deposited. After this, masking is done (FIGS. 5a and 5b, respectively) followed by a titanium nitride step with subsequent removal of the resist 30 to obtain the structures as shown in FIGS. 6a and 6b, respectively, including a titanium nitride film later forming the middle film 48 of the capacitor according to the invention (see FIG. 12b). Instead of titanium nitride any other suitable material, such as titanium tungsten, for instance, may be used for the middle film 48.

The next step in both methods of fabrication is depositing a pre-metal dielectric (PMD) layer 32 which is subsequently planarized by chemical-mechanical polishing. In the prior art fabrication method a PMD layer 32 10 kÅ thick above the shallow trench isolation 12, and 4 kÅ thick above the titanium nitride layer 28 is envisaged (FIG. 7a), whereas in the fabrication method according to the invention the thickness of the PMD layer 32 above the shallow trench isolation 12 is 8 to 9 kÅ. Due to it being elevated, the titanium nitride layer 28 is exposed following chemical-mechanical polishing. The fabrication method according to the invention then provides for deposition of a second dielectric 34, preferably an oxide or nitride on which, on which according to a first variant of the fabrication method a titanium nitride layer is deposited (FIG. 7b). This titanium nitride layer later serves as the CMP stop layer 36, i.e. as a stop layer for the chemical-mechanical polishing in a later step in the process. In a section variant of the fabrication method according to the invention (not shown), the CMP stop layer 36 is dispensed with. (Depositing the second dielectric 34 and CMP stop layer 36 in accordance with the first variant is not provided for in the prior art fabrication method).

Figure 10A:
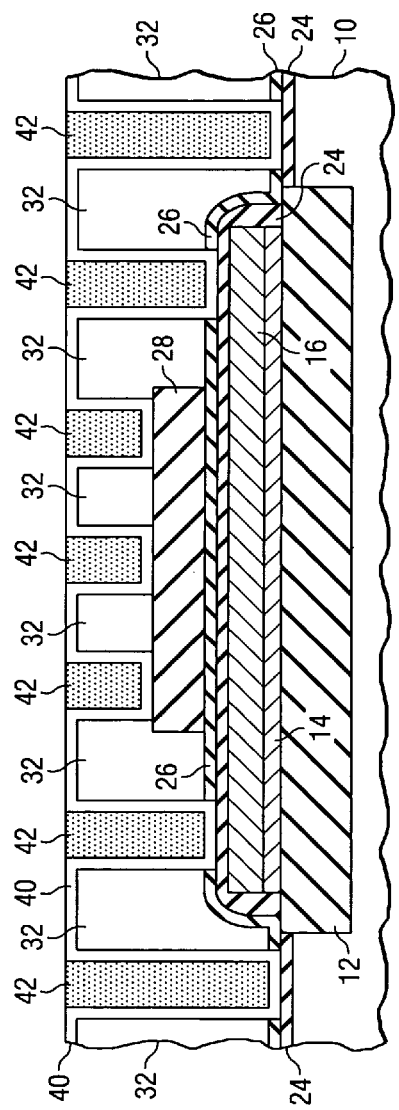
Figure 10B:
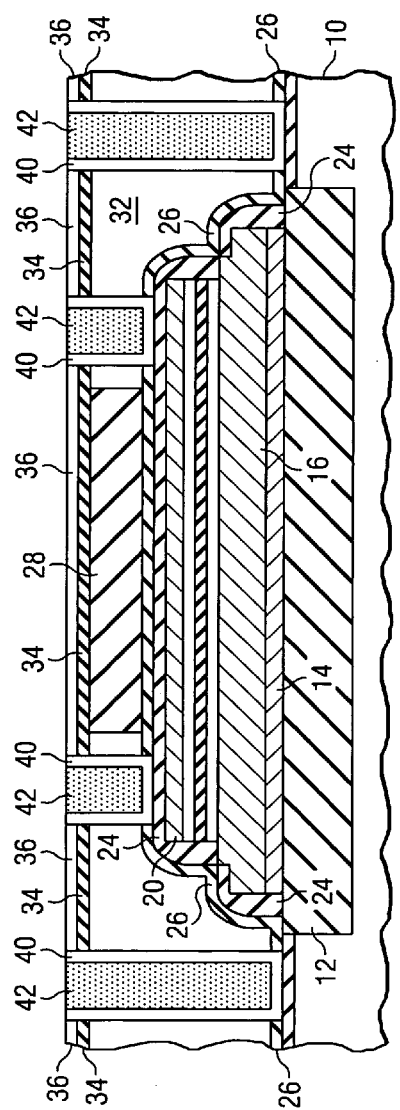

In both methods of fabrication a selective pre-metal dielectric etch is then carried out to create spaces 38 for contacts at predefined locations (FIGS. 8a and 9a/8b and 9b, respectively), in the first variant of the fabrication method according to the invention the CMP stop layer 36 previously being etched away at the corresponding locations. Following depositing of a metal barrier layer 40 the spaces 38 are filled with tungsten to form the contacts 42. In subsequent chemical-mechanical polishing to remove the excess material, in the prior art fabrication method the tungsten filling is removed down to the level of the barrier layer 40 just like in the fabrication method of the invention according to the second variant (FIG. 10a), in the first variant of the fabrication method according to the invention down to the level of the CMP stop layer 36 (FIG. 10b). In accordance with the first variant of the fabrication method of the invention the CMP stop layer 36 protects the second dielectric 34 from damage. In the second variant of the fabrication method according to the invention in which no CMP stop layer 36 is provided, either the barrier layer 40 needs to be thick enough to prevent damage of the second dielectric 34 by chemical-mechanical polishing or the tungsten excess is not removed by chemical-mechanical polishing but by W-etch-back.

Figure 11A:
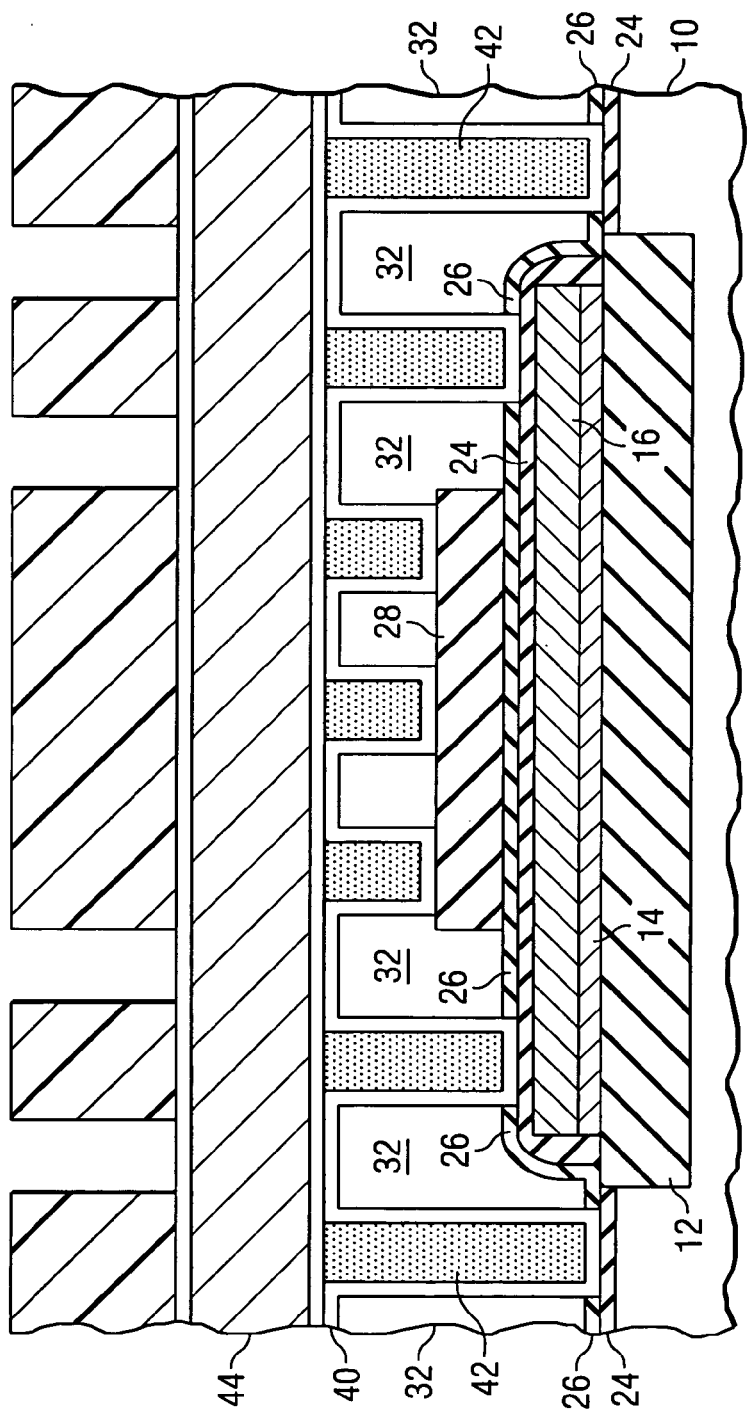
Figure 11B:
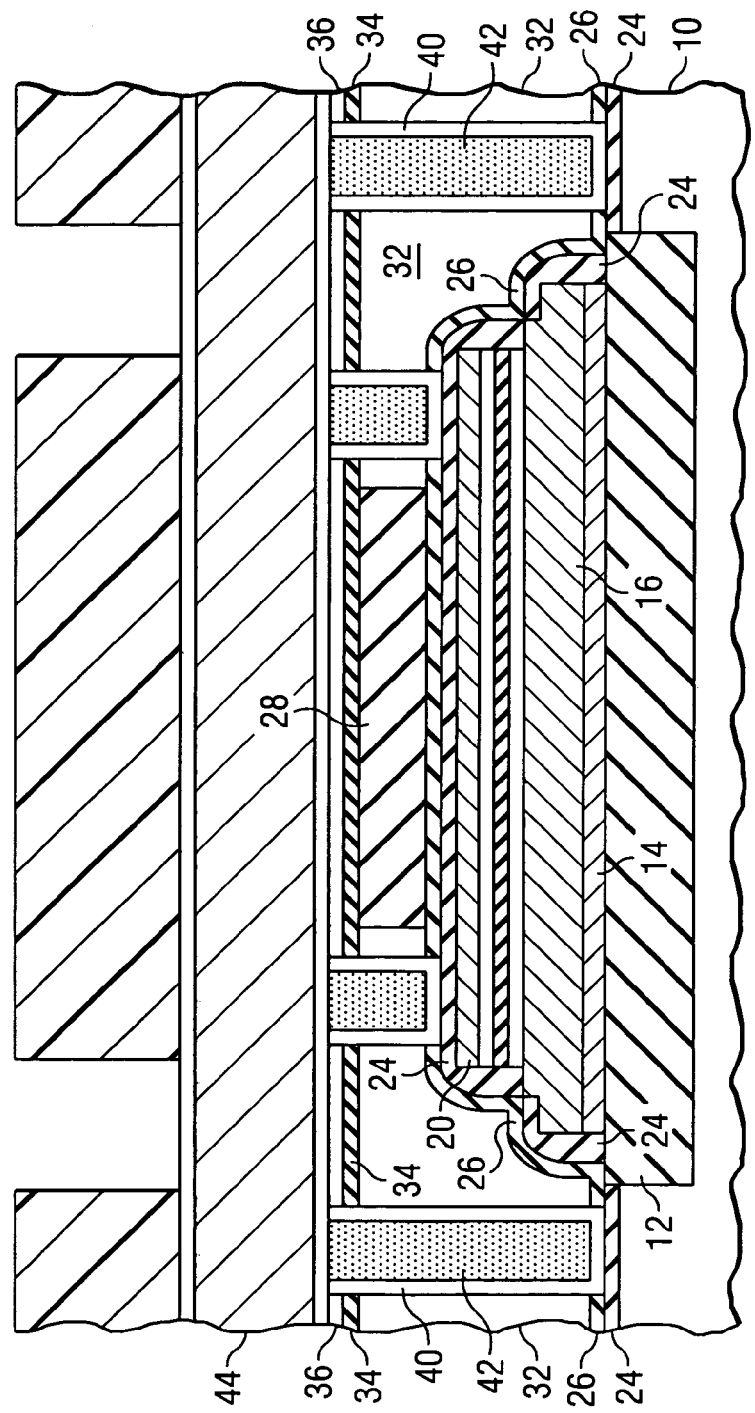
Figure 12A:
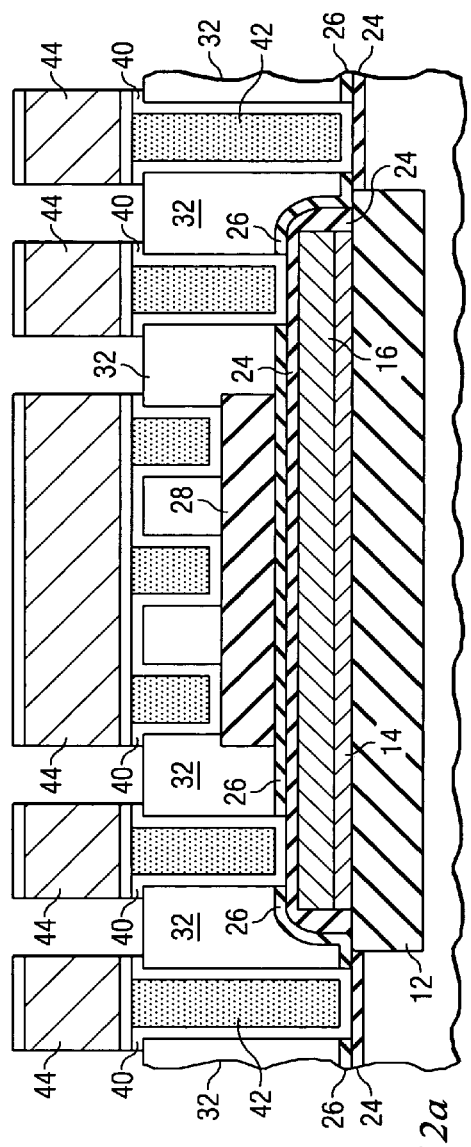
Figure 12B:
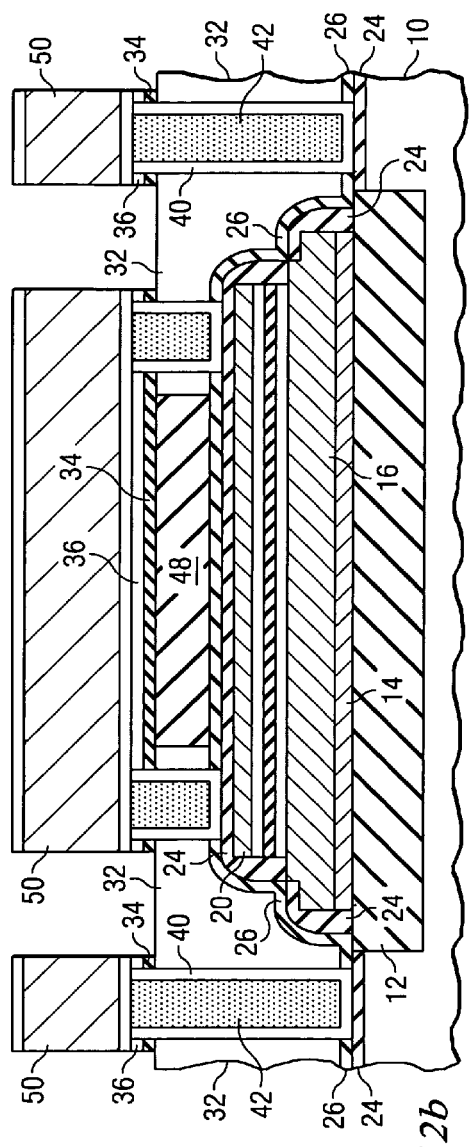
Figure 13A:
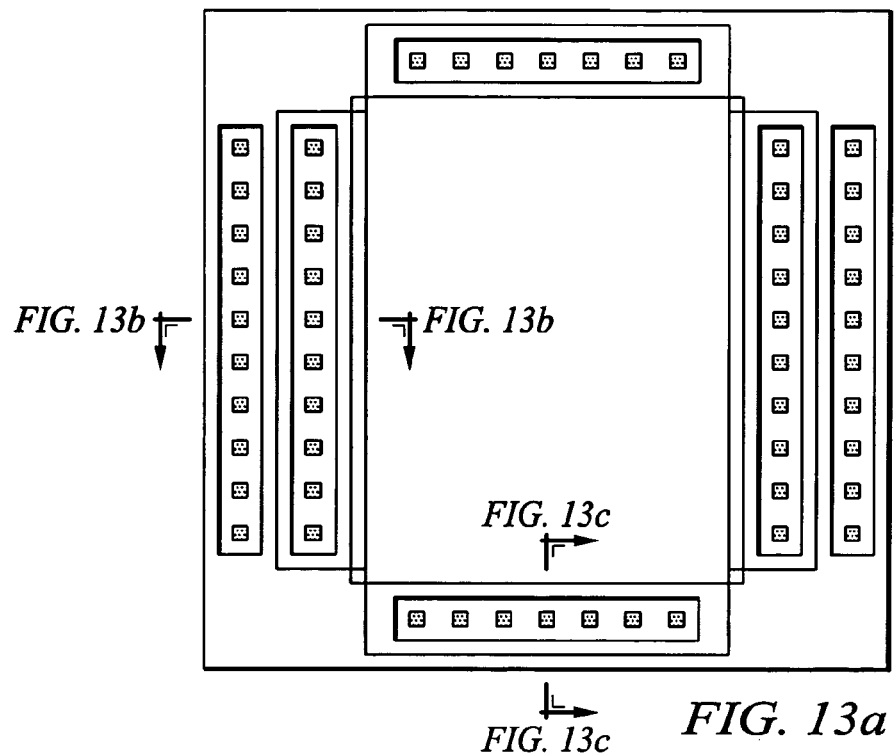
FIG. 13a is a plan view of a capacitor according to the invention in a first design variant.
Figure 13B:
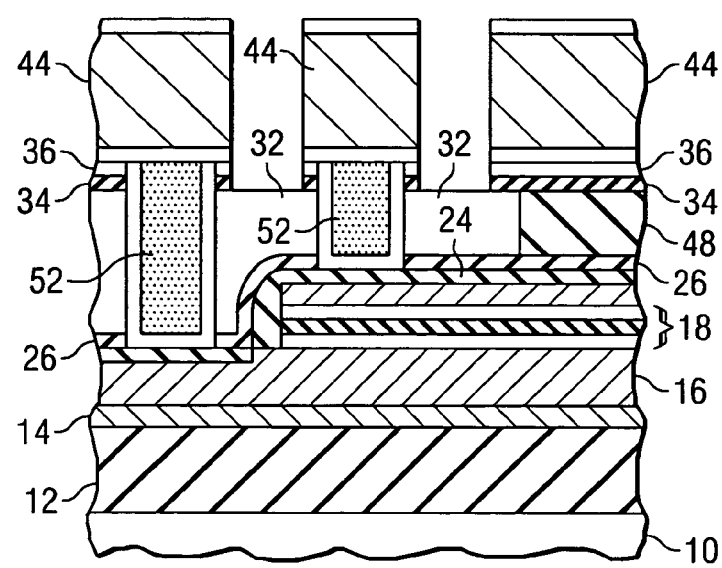
Figure 13C:
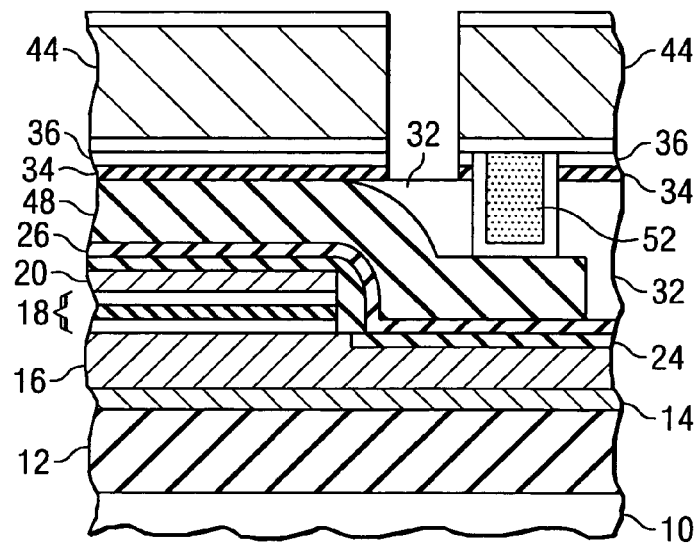
Figure 14A:
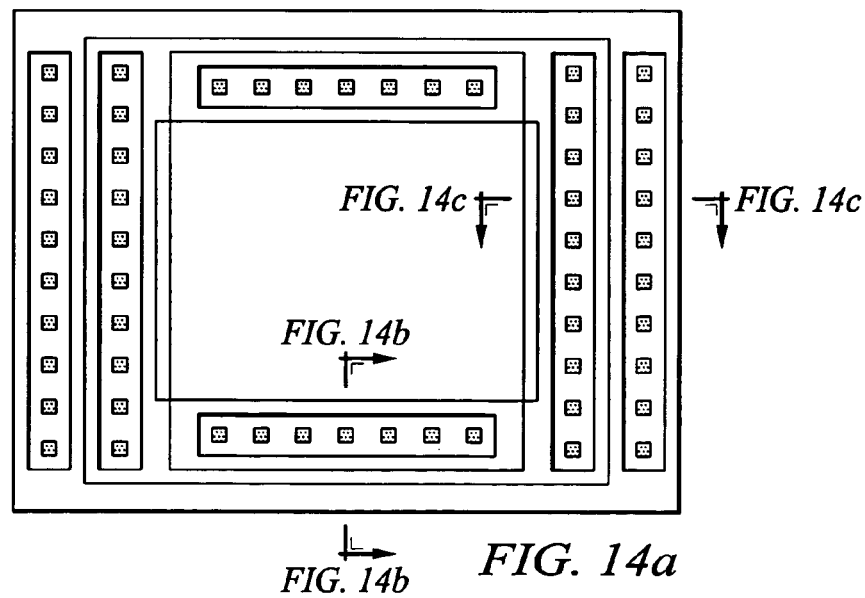
FIG. 14a is a plan view of a capacitor according to the invention in a second design variant.
Figure 14B:
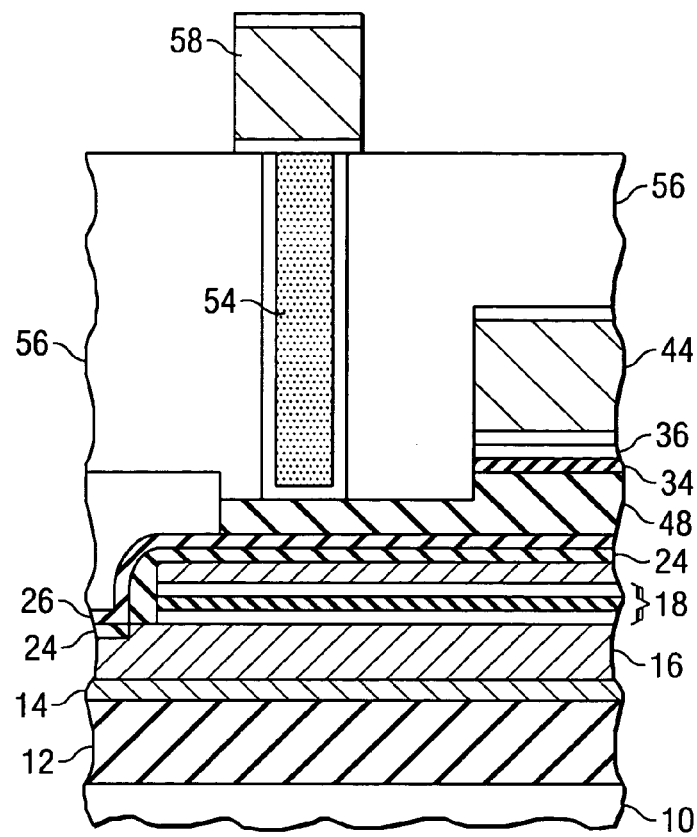
Figure 14C:
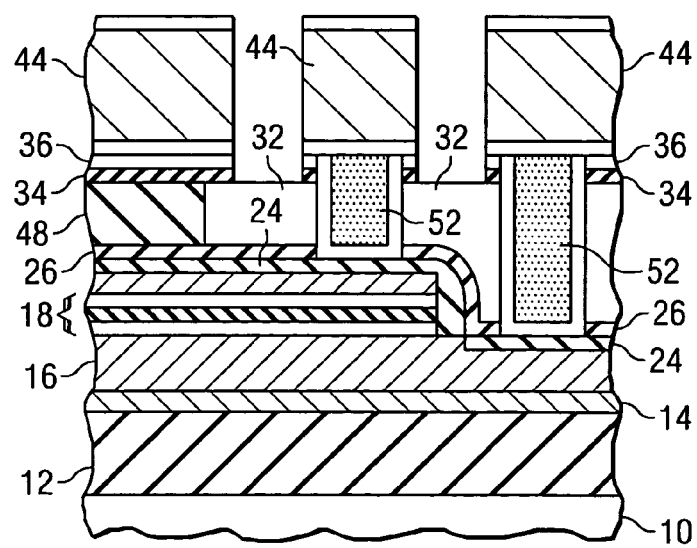

Then in both the prior art fabrication method and in the fabrication method according to the invention this is followed by deposition of a metallization layer 44, e.g. titanium nitride or titanium tungsten, which is patterned by known ways and means together with the barrier layer 40 (and in accordance with a first variant of the fabrication method according to the invention also including the CMP stop layer 36) and the second dielectric 34, as shown in FIGS. 11a and 12a/11b and 12b, respectively. With these steps in the process, the method of fabricating the prior art capacitor and the capacitor according to the invention is completed. The capacitor according to the invention thus comprises a lower capacitor film 46, a middle capacitor film 48 and an upper capacitor film 50 with a first dielectric 26 sandwiched between the lower capacitor film 46 and the middle capacitor film 48, and a second dielectric 34 between the middle capacitor film 48 and upper capacitor film 50.

As compared to the prior art method of fabrication, depositing the second dielectric 34 is the sole additional working step mandatory for fabrication of the capacitor according to the invention. As aforementioned, depositing the titanium nitride layer serving as the CMP stop layer 36 (FIG. 7b) can be dispensed with when, instead of chemical-mechanical polishing the tungsten filling, etching back the tungsten excess is implemented or when the later formed barrier layer 40 is thick enough to stop the chemical-mechanical polishing before attaining the second dielectric 34. Otherwise, the novel structure of the capacitor according to the invention materializes solely from the difference in patterning the individual layers.

Referring now to FIGS. 13a, 13b, 13c and 14a, 14b, 14c there are illustrated two possible design variants of the capacitor according to the invention. In the first design variant the middle film 48 is connected to a contact 52 (see FIG. 13c) which connects the metallization layer 44. In the second design variant the middle film 48 is connected to a contact 54 (Via) extending through an intermediate layer dielectric 56 and connecting a metallization layer 58 of another component at a higher level.

Depending on the dielectric materials used and how the capacitor films 46, 48, 50 are circuited, the properties of the capacitor according to the invention can be tailored as listed in the following Table. The same signs (+ or −) within each line of the Table indicate that the corresponding capacitor films 46, 48, 50 receive the same potential, in other words are "short-circuited".

| first dielectric | second dielectric | upper film | middle film | lower film | max. capacitive density | capacitor property |
|---|---|---|---|---|---|---|
| nitride | oxide | + | − | + | 4.5 fF/$\mu m^2$ | high capacitive density |
| nitride | oxide | + | − | − | 1.5 fF/$\mu m^2$ | high precision |
| nitride | oxide | + | + | − | 3 fF/$\mu m^2$ | high capacitive density |
| nitride | nitride | + | − | + | 6 fF/$\mu m^2$ | very high capacitive density |
| nitride | nitride | + | − | − | 3 fF/$\mu m^2$ | high capacitive density |
| nitride | nitride | + | + | − | 3 fF/$\mu m^2$ | high capacitive density |
| oxide | oxide | + | − | + | 3 fF/$\mu m^2$ | high capacitive density and high precision |
| oxide | oxide | + | − | − | 1.5 fF/$\mu m^2$ | high precision |
| oxide | oxide | + | + | − | 1.5 fF/$\mu m^2$ | high precision |

The invention claimed is:

1. An integrated stacked capacitor comprising:
   a first capacitor film of polycrystalline silicide (poly), wherein said first capacitor film is arranged on an oxide-nitride-oxide layer sequence which is in turn arranged on a lower polysilicide layer;
   a second capacitor film;
   a first dielectric sandwiched between said first capacitor film and said second capacitor film;
   a second dielectric; and
   a third capacitor film, wherein said second dielectric is sandwiched between said second capacitor film and said third capacitor film.

2. The capacitor as set forth in claim 1, wherein said second capacitor film comprises titanium nitride or a titanium alloy.

3. The capacitor as set forth in claim 1, wherein said third capacitor film comprises titanium nitride or a titanium alloy.

4. The capacitor as set forth in claim 1, wherein said first dielectric comprises a nitride and said second dielectric comprises an oxide.

5. The capacitor as set forth in claim 1, wherein said first dielectric and said second dielectric each comprise a nitride.

6. The capacitor as set forth in claim 1, wherein said first dielectric and said second dielectric each comprise an oxide.

7. The capacitor as set forth in claim 1, wherein said second capacitor film is connected to a contact connecting a metallization layer from which said third capacitor film is also formed.

* * * * *